(12) United States Patent
Borgwardt et al.

(10) Patent No.: US 10,209,280 B2
(45) Date of Patent: Feb. 19, 2019

(54) CIRCUIT BREAKER

(71) Applicant: Siemens Aktiengesellschaft, München (DE)

(72) Inventors: Andre Borgwardt, Schoenwalde-Ot Paaren (DE); Marco Bruell, Berlin (DE); Peter Kopaczewski, Berlin (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 78 days.

(21) Appl. No.: 14/961,979

(22) Filed: Dec. 8, 2015

(65) Prior Publication Data
US 2016/0178673 A1 Jun. 23, 2016

(30) Foreign Application Priority Data

Dec. 18, 2014 (DE) .................. 10 2014 226 399
Sep. 4, 2015 (DE) .................. 10 2015 216 981

(51) Int. Cl.
*G01R 19/252* (2006.01)
*G01R 19/25* (2006.01)
(Continued)

(52) U.S. Cl.
CPC ........ *G01R 19/2509* (2013.01); *G01R 15/181* (2013.01); *H01H 71/123* (2013.01)

(58) Field of Classification Search
CPC .......... G01D 4/00; G01R 11/00; G01R 11/32; G01R 11/34; G01R 11/48; G01R 11/56; G01R 11/64; G01R 19/2503; G01R 22/00; G01R 22/061; G01R 15/185; G01R 19/03; G01R 19/18; G01R 19/22; H01L 41/044; H02M 2001/007
See application file for complete search history.

(56) References Cited

U.S. PATENT DOCUMENTS 5,061,890 A 10/1991 Longini
2002/0003586 A1* 1/2002 Busson ............... H03G 3/3068
348/731
(Continued)

FOREIGN PATENT DOCUMENTS

CN 1821794 A 8/2006
CN 104504272 A 4/2015
DE 202008018257 U1 6/2012

OTHER PUBLICATIONS

Office Action for Chinese Patent Application No. 201510940400.5 dated Jan. 26, 2018 and English translation thereof.
(Continued)

*Primary Examiner* — Tung X Nguyen
(74) *Attorney, Agent, or Firm* — Harness, Dickey & Pierce, P.L.C.

(57) ABSTRACT

A circuit breaker for a low-voltage circuit is disclosed. In an embodiment, the circuit breaker includes a current conductor, assigned a measuring transducer for measuring the electrical current of the current conductor; a first filter connected to the measuring transducer; an analog/digital converter connected to the first filter; a second, high-pass filter connected to the analog/digital converter; and a digital integrator, connected to the high-pass filter and configured to determine the electrical current of the current conductor.

18 Claims, 1 Drawing Sheet

(51) Int. Cl.
*H01H 71/12* (2006.01)
*G01R 15/18* (2006.01)

(56) References Cited

U.S. PATENT DOCUMENTS

| | | |
|---|---|---|
| 2003/0090356 A1 | 5/2003 | Saito et al. |
| 2007/0279042 A1 | 12/2007 | Tan et al. |
| 2009/0109589 A1* | 4/2009 | Yoo .......................... H02H 3/10 |
| | | 361/93.1 |
| 2010/0007332 A1 | 1/2010 | Naumann et al. |
| 2011/0026180 A1* | 2/2011 | Haible ................ H03F 3/45475 |
| | | 361/93.1 |
| 2013/0336551 A1* | 12/2013 | Clingman ............ A61B 5/0095 |
| | | 382/128 |

OTHER PUBLICATIONS

Office Action for German Patent Application No. 10 2015 216 981.2 dated Oct. 10, 2018.

\* cited by examiner

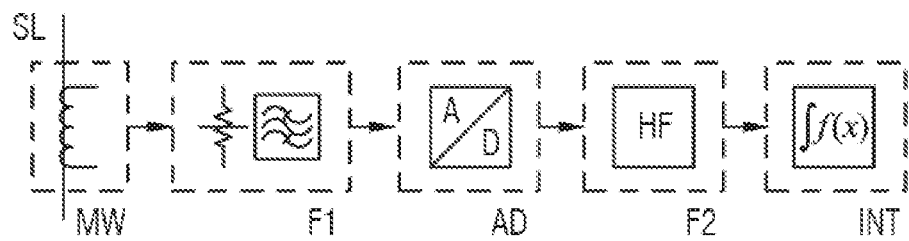

CIRCUIT BREAKER

PRIORITY STATEMENT

The present application hereby claims priority under 35 U.S.C. § 119 to German patent application number DE 102014226399.9 filed Dec. 18, 2014, and to German patent application number DE 102015216981.2 filed Sep. 4, 2015, the entire contents of each of which are hereby incorporated herein by reference.

FIELD

At least one embodiment of the invention generally relates to a circuit breaker for a low-voltage circuit.

BACKGROUND

Circuit breakers for low-voltage circuits are generally known. They are available in different designs which are referred to as molded case circuit breakers, air circuit breakers etc. A low-voltage circuit is used to mean a circuit or an electrical installation for voltages of up to 1000 V AC or 1500 V DC.

Circuit breakers monitor the electrical circuit for the presence of current or other electrical conditions. Circuit breakers interrupt the electrical circuit, in particular in the case of short circuits or overcurrents which exceed previously stipulated current values.

Different measuring transducers are used to measure the electrical current of an electrical conductor. These measuring transducers generally provide a variable proportional to the electrical current of the electrical conductor or an equivalent.

As measuring transducers for the electrical current, use is made, for example, of transformers or Rogowski transducers. The latter provide a voltage or a voltage signal which corresponds to the derivative of the electrical current I of the electrical conductor.

$$u = M * \frac{dI}{dt}$$

Rogowski transducers (air coil without an iron core) have the advantage of a very large current and frequency measurement range and are therefore preferably used as measuring transducers or current sensors in circuit breakers for low voltage.

The constant M, the so-called mutual inductance, is dependent on the physical structure of the Rogowski transducer, that is to say dependent on the number of turns, cross-sectional area etc.

The transducer voltage must be integrated in order to obtain a signal proportional to the conductor current. Integration is required, in particular, when non-sinusoidal currents are present or when an active power or a reactive power is intended to be determined from the measured current and the measured voltage since the phase shift is important here. The integration is carried out with the aid of an analog integrator which is passive in most cases.

An analog integrator is implemented using real components afflicted with loss and production process tolerances. In particular, the actual integration capacitor has a great influence on the overall behavior of the integrator circuit.

The integration circuit has a considerable influence on the measurement accuracy of the corresponding measuring circuit. Temperature dependence, in particular, is a problem. In order to maintain narrow tolerance bands, the measuring circuits are calibrated, that is to say factors which are used to continuously correct the measured values are determined. The properties of the components of the integration circuit change as a result of the influence of the temperature, which results in a deviation of the measured values. This effect can be reduced by way of a complicated temperature-dependent method for correcting the measured values or by using components with the smallest possible temperature drift for the circuit. However, this has the disadvantage of higher costs.

On account of the real properties of the analog integrator circuit, the measuring transducer signal or the Rogowski transducer voltage signal, which corresponds to the derivative of the current, is not completely or ideally transformed back or integrated. This produces a frequency-dependent phase shift, that is to say the phase is distorted. This can result in signal waveform distortion in mixed signals.

A phase error between the current and the voltage, which is produced on account of this analog integration, often cannot be completely eliminated. Consequently, current signals which have been shifted in this manner then result, for example, in incorrect measured power values, for example with regard to the active power.

The problem of analog integration has previously been solved by way of complicated calibration, components with nominal tolerances which are as tight as possible and with little temperature drift as well as complicated correction methods.

SUMMARY

At least one embodiment of the present invention improves the determination of measured currents.

At least one embodiment of the present invention is directed to a circuit breaker.

At least one embodiment of the invention proposes that, instead of the analog integration circuit, digital integration with an upstream filter is carried out in a circuit breaker, in particular for low voltage. This has the particular advantage that the problems mentioned, such as temperature drift, phase errors etc., are avoided. This makes it possible to correctly determine the current, thus making it possible to correctly calculate the active power and to implement further applications in circuit breakers, for example with regard to power management. Correct measurement of the electrical power values is of elementary importance for these applications.

Advantageous refinements of the invention are stated in the subclaims.

The described properties, features and advantages of this invention and the manner in which they are achieved become clearer and more clearly comprehensible in connection with the following description of the exemplary embodiments, which are explained in more detail in connection with the drawing.

BRIEF DESCRIPTION OF THE DRAWINGS

In this case, the FIGURE shows a block diagram for explaining an embodiment of the invention.

DETAILED DESCRIPTION OF THE EXAMPLE EMBODIMENTS

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the FIGURES.

Before discussing example embodiments in more detail, it is noted that some example embodiments are described as processes or methods depicted as flowcharts. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the FIGURE. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Further, although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGURES. For example, two FIGURES shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Spatially relative terms, such as "beneath", "below", "lower", "above", "upper", and the like, may be used herein for ease of description to describe one element or feature's relationship to another element(s) or feature(s) as illustrated in the FIGURES. It will be understood that the spatially relative terms are intended to encompass different orientations of the device in use or operation in addition to the orientation depicted in the FIGURES. For example, if the device in the FIGURES is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/ hardware, that manipulates and transforms data represented as physical, electronic quantities within the computer system's registers and memories into other data similarly represented as physical quantities within the computer system memories or registers or other such information storage, transmission or display devices.

At least one embodiment of the invention proposes that, instead of the analog integration circuit, digital integration with an upstream filter is carried out in a circuit breaker, in particular for low voltage. This has the particular advantage that the problems mentioned, such as temperature drift, phase errors etc., are avoided. This makes it possible to correctly determine the current, thus making it possible to correctly calculate the active power and to implement further applications in circuit breakers, for example with regard to power management. Correct measurement of the electrical power values is of elementary importance for these applications.

In one advantageous refinement of an embodiment of the invention, the digital integrator is a two-stage digital integrator. This has the particular advantage that a more accurate approximate value becomes possible in a secondary calculation for the electrical current, in particular when the secondary calculation is carried out with twice the strip width.

In one advantageous refinement of an embodiment of the invention, the first filter is a low-pass or bandpass filter. This has the particular advantage that band limitation of the measured values is carried out, thus enabling simpler digital further processing.

In one advantageous refinement of an embodiment of the invention, the second filter is a high-pass filter. This has the particular advantage that a possible offset after the analog/ digital conversion is minimized and it is therefore possible to more accurately determine the current.

In one advantageous refinement of an embodiment of the invention, the second filter is a digital filter. This has the particular advantage that digital filtering is carried out in connection with the digital integration, which can be implemented together particularly well and in a compatible manner.

In one advantageous refinement of an embodiment of the invention, the first filter is a multistage filter. This has the particular advantage that it is possible to determine current values in a particularly accurate manner as a result of the better filter effect.

In one advantageous refinement of an embodiment of the invention, the second filter is in the form of an infinite impulse response filter or IIR filter. This has the particular advantage that a maximum filter effect is achieved with a minimum outlay on filter stages.

In one advantageous refinement of an embodiment of the invention, the second filter has components/processing which carry out a fast Fourier transform and an inverse fast Fourier transform. This has the particular advantage that the continuous measured values can be filtered in a particularly simple manner in the frequency domain.

In one advantageous refinement of an embodiment of the invention, the digital integrator has a microprocessor which is configured in such a manner that two-stage discrete integration is carried out. This has the particular advantage that simple implementation in firmware of a microprocessor is enabled and a more accurate approximate value additionally becomes possible during a secondary calculation for the electrical current.

All of the refinements of embodiments of the invention more accurately determine the current. In particular, temperature dependences and phase errors are avoided according to embodiments of the invention.

The figure shows a current conductor SL, for example for a circuit or current channel of a circuit breaker, such as a low-voltage circuit breaker, which is assigned a measuring transducer MW. The measuring transducer MW may be, for example, a Rogowski transducer. The latter is connected to a first filter F1. The first filter F1 may be a multistage filter. It may be a low-pass or bandpass filter. Furthermore, the first filter F1 may also carry out signal scaling or amplitude matching. The first filter F1 is connected to an analog/digital converter AD. The latter is in turn connected to a second filter F2. The second filter F2 may be a digital filter. It may be a high-pass filter. The second filter F2 may be in the form of an infinite impulse response filter or IIR filter, for example. It may be a three-pole filter, for example. The second filter F2 may carry out a fast Fourier transform or inverse fast Fourier transform in order to achieve simple filtering in the frequency domain.

A digital integrator which is in the form of a microprocessor with firmware, for example, adjoins the second filter.

In this case, it is possible to effect simple and advantageously two-stage discrete integration.

The functional principle of the numerical integration shall be explained briefly below.

For implementing the digital integration (approximation for the definite integral), there are mathematical methods which calculate a continuous integration function f(x) on the basis of the area calculation.

In order to replace the analog integration circuit, discrete or digital integration corresponding to Simpson's formula known from mathematics is proposed here. In order to improve the result of the calculation (approximate value compared with the exact value), the calculation rule is carried out twice with twice the step size the second time.

This mathematical calculation rule according to Simpson is as follows in this case:

$$\int_a^b f(x)dx \approx \frac{h}{3}(\Sigma_0 + 4*\Sigma_1 + 2*\Sigma_2)$$

with the following subtotals:

$$\Sigma_0 = y_0 + y_{2n}$$

$$\Sigma_1 = y_1 + y_3 + \ldots + y_{2n-1}$$

$$\Sigma_2 = y_2 + y_4 + \ldots + y_{2n-2}$$

In this case, $y_k$ are the interpolation values (samples) of the function $y=f(x)$ ($k=0, 1, \ldots, 2n$) and $$h = \frac{b-a}{2n}$$

is the width of an area strip between two interpolation points (samples).

As already mentioned above, a more accurate approximate value is obtained with a secondary calculation with twice the strip width 2h.

With the result from the primary calculation $I_e$ and the result from the secondary calculation $I_z$, an improved final result $I_v$ is calculated as follows:

$$I_v = I_e + \left(\frac{1}{15}(I_e - I_z)\right)$$

The implementation/calculation of the algorithm in a microprocessor or μC of the circuit breaker, for example in an electronic trip unit of a circuit breaker, is carried out in a sliding manner (moving window) on a functional section with a window length of T/2. The number of area strips which are calculated must be even. The number of interpolation points (samples) is therefore always uneven. The sampling frequency of the analog/digital converter AD should correspond to the integer multiple of the signal frequency. A high-pass filter which is likewise digital is connected upstream of the digital integrator for offset elimination.

An embodiment of the invention is implemented particularly well if two-stage discrete integration with an upstream digital high-pass filter is used as a replacement for an analog integration circuit in connection with Rogowski measuring transducers.

The problems of the analog integrator are solved by way of the invention and the digital integration method, in particular the temperature dependence of the integration circuit (temperature-induced offset->resulting in: inaccuracy of the amplitude to be measured) and the phase shift of the reconstructed signal in the current branch (results in: errors in the power calculation).

Although the invention was described and illustrated more specifically in detail by way of the example embodiment, the invention is not restricted by the disclosed examples, and other variations can be derived therefrom by a person skilled in the art without departing from the scope of protection of the invention.

The aforementioned description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

The patent claims filed with the application are formulation proposals without prejudice for obtaining more extensive patent protection. The applicant reserves the right to claim even further combinations of features previously disclosed only in the description and/or drawings.

The example embodiment or each example embodiment should not be understood as a restriction of the invention. Rather, numerous variations and modifications are possible in the context of the present disclosure, in particular those variants and combinations which can be inferred by the person skilled in the art with regard to achieving the object for example by combination or modification of individual features or elements or method steps that are described in connection with the general or specific part of the description and are contained in the claims and/or the drawings, and, by way of combinable features, lead to a new subject matter or to new method steps or sequences of method steps, including insofar as they concern production, testing and operating methods. Further, elements and/or features of different example embodiments may be combined with each other and/or substituted for each other within the scope of this disclosure and appended claims.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

Still further, any one of the above-described and other example features of the present invention may be embodied in the form of an apparatus, method, system, etc. For example, of the aforementioned methods may be embodied in the form of a system or device, including, but not limited to, any of the structure for performing the methodology illustrated in the drawings.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A circuit breaker for a low-voltage circuit, comprising: a low voltage circuit breaker having a series of:
   a current conductor, assigned a measuring transducer to measure electrical current of the current conductor;
   a first filter connected to the measuring transducer;
   an analog/digital converter, connected to the first filter;
   a second filter, connected to the analog/digital converter; and
   a digital integrator, connected to the second filter at a position downstream of the second filter and configured to determine the electrical current of the current conductor.

2. The circuit breaker of claim 1, wherein the digital integrator is a two-stage digital integrator.

3. The circuit breaker of claim 1, wherein the first filter is a low-pass or bandpass filter.

4. The circuit breaker of claim 1, wherein the second filter is a high-pass filter.

5. The circuit breaker of claim 1, wherein the second filter is a digital filter.

6. The circuit breaker of claim 1, wherein the first filter is a multistage filter.

7. The circuit breaker of claim 1, wherein the second filter is in the form of an infinite impulse response filter.

8. The circuit breaker of claim 1, wherein the second filter includes components configured to carry out a fast Fourier transform and an inverse fast Fourier transform.

9. The circuit breaker of claim 2, wherein the digital integrator includes a microprocessor, configured to carry out two-stage discrete integration.

10. The circuit breaker of claim 9, wherein the digital integrator is configured to carry out the integration using Simpson's formula.

11. The circuit breaker of claim 9, wherein the digital integrator is configured to carry out calculations with twice a strip width in a secondary calculation during the two-stage integration.

12. The circuit breaker of claim 3, wherein the second filter is a high-pass filter.

13. The circuit breaker of claim 3, wherein the second filter is a digital filter.

14. The circuit breaker of claim 2, wherein the first filter is a multistage filter.

15. The circuit breaker of claim 3, wherein the second filter is in the form of an infinite impulse response filter.

16. The circuit breaker of claim 3, wherein the second filter includes components configured to carry out a fast Fourier transform and an inverse fast Fourier transform.

17. The circuit breaker of claim 1, wherein the first filter is directly connected to the current conductor, the analog/digital converter is directly connected to the first filter, the second filter is directly connected to the analog/digital converter, and the digital integrator is directly connected to the second filter.

18. The circuit breaker of claim 1, wherein the low voltage circuit breaker is configured for voltages up to 1500 volt dc.

* * * * *